(12) United States Patent
Okuno (10) Patent No.: US 7,989,238 B2
(45) Date of Patent: Aug. 2, 2011

(54) GROUP III NITRIDE-BASED COMPOUND SEMICONDUCTOR LIGHT-EMITTING DEVICE AND PRODUCTION METHOD THEREFOR

(75) Inventor: Koji Okuno, Aichi (JP)

(73) Assignee: Toyoda Gosei Co., Ltd., Nishikasugai-Gun, Aichi-Ken (JP)

( * ) Notice: Subject to any disclaimer, the term of this patent is extended or adjusted under 35 U.S.C. 154(b) by 182 days.

(21) Appl. No.: 12/457,431

(22) Filed: Jun. 10, 2009

(65) Prior Publication Data

US 2009/0309126 A1  Dec. 17, 2009

(30) Foreign Application Priority Data

Jun. 16, 2008  (JP) .................. 2008-156829

(51) Int. Cl.
*H01L 21/00* (2006.01)

(52) U.S. Cl. ........... 438/29; 438/22; 438/42; 438/44; 257/79; 257/80; 257/98; 257/E21.097; 257/E21.108; 257/E21.126; 257/E21.117; 257/E21.398; 257/E21.386

(58) Field of Classification Search ........... 438/22, 438/29–32, 39, 41, 42; 257/79, 80, 85, 87, 257/98, E21.097, E21.098, E21.108, E21.112, 257/E21.117, E21.118, E21.126, E21.157, 257/E21.172, E21.386, E21.398
See application file for complete search history.

(56) References Cited

U.S. PATENT DOCUMENTS

| | | | |
|---|---|---|---|
| 5,962,875 A * | 10/1999 | Motoki et al. ......... 257/103 |
| 6,683,898 B2 * | 1/2004 | Ostergaard et al. ...... 372/43.01 |
| 6,777,257 B2 * | 8/2004 | Shinohara et al. ......... 438/45 |
| 6,784,462 B2 * | 8/2004 | Schubert ................ 257/98 |
| 6,852,161 B2 * | 2/2005 | Urashima et al. .......... 117/104 |
| 6,903,379 B2 * | 6/2005 | Wang et al. ............. 257/98 |
| 6,998,649 B2 * | 2/2006 | Hata ................... 257/99 |
| 7,067,849 B2 * | 6/2006 | Yoo .................... 257/102 |
| 7,135,713 B2 * | 11/2006 | Chen ................... 257/98 |
| 7,145,180 B2 * | 12/2006 | Shinohara et al. ......... 257/85 |
| 7,498,182 B1 * | 3/2009 | Sampath et al. ........... 438/21 |
| 7,619,357 B2 * | 11/2009 | Onishi et al. ............ 313/506 |
| 7,872,268 B2 * | 1/2011 | Emerson ................ 257/103 |
| 2003/0077847 A1 * | 4/2003 | Yoo .................... 438/22 |
| 2004/0023426 A1 * | 2/2004 | Shinohara et al. ......... 438/47 |
| 2004/0031967 A1 * | 2/2004 | Fudeta et al. ............ 257/79 |

(Continued)

FOREIGN PATENT DOCUMENTS

EP       1265272 A1 *  12/2002

*Primary Examiner* — Alexander G Ghyka
*Assistant Examiner* — Leonard Chang
(74) *Attorney, Agent, or Firm* — McGinn IP Law Group, PLLC (57) ABSTRACT

Provided is a Group III nitride-based compound semiconductor light-emitting device including aluminum regions. The Group III nitride-based compound semiconductor light-emitting device includes a sapphire substrate; aluminum regions which are formed on the substrate; an AlN buffer layer; an Si-doped GaN n-contact layer; an n-cladding layer formed of multiple layer units, each including an undoped $In_{0.1}Ga_{0.9}N$ layer, an undoped GaN layer, and a silicon (Si)-doped GaN layer; an MQW light-emitting layer including alternately stacked eight well layers formed of $In_{0.2}Ga_{0.8}N$ and eight barrier layers formed of GaN and $Al_{0.06}Ga_{0.94}N$; a p-cladding layer formed of multiple layers including a p-type $Al_{0.3}Ga_{0.7}N$ layer and a p-type $In_{0.08}Ga_{0.92}N$ layer; a p-contact layer having a layered structure including two p-type GaN layers having different magnesium concentrations; and an ITO light-transmitting electrode.

7 Claims, 5 Drawing Sheets

U.S. PATENT DOCUMENTS

| | | | |
|---|---|---|---|
| 2004/0104395 A1* | 6/2004 | Hagimoto et al. | 257/79 |
| 2004/0142503 A1* | 7/2004 | Lee et al. | 438/47 |
| 2005/0001224 A1* | 1/2005 | Chen | 257/98 |
| 2005/0001226 A1* | 1/2005 | Chen | 257/98 |
| 2005/0067625 A1* | 3/2005 | Hata | 257/81 |
| 2005/0077820 A1* | 4/2005 | Onishi et al. | 313/506 |
| 2005/0205884 A1* | 9/2005 | Kim et al. | 257/98 |
| 2005/0247950 A1* | 11/2005 | Nakamura et al. | 257/98 |
| 2006/0027831 A1* | 2/2006 | Kioke et al. | 257/103 |
| 2006/0038190 A1* | 2/2006 | Park et al. | 257/95 |
| 2006/0076565 A1* | 4/2006 | Murofushi et al. | 257/79 |
| 2006/0083148 A1* | 4/2006 | Yokoyama | 369/112.04 |
| 2006/0118803 A1* | 6/2006 | Lee et al. | 257/98 |
| 2006/0258027 A1* | 11/2006 | Ohmae et al. | 438/22 |
| 2006/0267029 A1* | 11/2006 | Li | 257/79 |
| 2007/0120136 A1* | 5/2007 | Noda et al. | 257/98 |
| 2008/0048176 A1* | 2/2008 | Orita et al. | 257/22 |
| 2008/0135864 A1* | 6/2008 | David et al. | 257/98 |
| 2008/0277678 A1* | 11/2008 | Li et al. | 257/94 |
| 2008/0277682 A1* | 11/2008 | Mishra et al. | 257/98 |
| 2009/0015142 A1* | 1/2009 | Potts et al. | 313/504 |
| 2009/0015757 A1* | 1/2009 | Potts et al. | 349/69 |
| 2009/0032830 A1* | 2/2009 | Li | 257/98 |
| 2010/0025684 A1* | 2/2010 | Shinohara et al. | 257/49 |

* cited by examiner

GROUP III NITRIDE-BASED COMPOUND SEMICONDUCTOR LIGHT-EMITTING DEVICE AND PRODUCTION METHOD THEREFOR

BACKGROUND OF THE INVENTION

1. Field of the Invention

The present invention relates to a Group III nitride-based compound semiconductor light-emitting device, and to a method for producing the device. As used herein, "Group III nitride-based compound semiconductor" encompasses a semiconductor represented by the formula $Al_xGa_yIn_{1-x-y}N$ ($0 \leq x \leq 1$, $0 \leq y \leq 1$, $0 \leq x+y \leq 1$); such a semiconductor containing a predetermined element so as to attain, for example, an n-type/p-type conduction; and such a semiconductor in which a portion of a Group III element is substituted by B or Tl, or a portion of the Group V element is substituted by P, As, Sb, or Bi.

2. Background Art

Japanese Patent Application Laid-Open (kokai) No. 2000-049092 and Japanese Kohyo Patent Publication No. 2004-507106 disclose a technique in which an aluminum layer or aluminum particles are provided on a substrate; the layer or the particles are completely nitrided to thereby form a single-crystal layer or a buffer layer; and a layer of a Group III nitride-based compound semiconductor having a predetermined composition is stacked on the single-crystal layer or the buffer layer.

SUMMARY OF THE INVENTION

The present inventors have conducted further studies on the aforementioned technique, and have found that light emission performance is improved by intentionally providing metallic aluminum regions between a substrate and a Group III nitride-based compound semiconductor layer. The present invention has been accomplished on the basis of this finding.

In a first aspect of the present invention, there is provided a Group III nitride-based compound semiconductor light-emitting device comprising a substrate, and a Group III nitride-based compound semiconductor single-crystal layer, wherein metallic aluminum regions are provided between the substrate and the single-crystal layer.

In a second aspect of the present invention, there is provided a method for producing a Group III nitride-based compound semiconductor light-emitting device, comprising forming metallic aluminum regions on a substrate; forming a Group III nitride-based compound semiconductor single-crystal layer, via a buffer layer, on a portion of the substrate on which no metallic aluminum regions are formed, so that the metallic aluminum regions are covered with the Group III nitride-based compound semiconductor single-crystal layer; and stacking, on the Group III nitride-based compound semiconductor single-crystal layer, a Group III nitride-based compound semiconductor layer having a predetermined composition and containing an impurity of interest. As used herein, the expression "forming metallic aluminum regions on a substrate" refers to the case where metallic aluminum regions are formed on the substrate in an island-like pattern (e.g., a dot pattern, a stripe pattern, or a grid pattern). The metallic aluminum regions may be provided regularly or randomly.

A third aspect of the present invention is drawn to a specific embodiment of the production method according to the second aspect, wherein dents are formed in the substrate, and the metallic aluminum regions are formed in the dents.

A fourth aspect of the present invention is drawn to a specific embodiment of the production method according to the second or third aspect, wherein the buffer layer is formed on the substrate before formation of the metallic aluminum regions.

A fifth aspect of the present invention is drawn to a specific embodiment of the production method according to the fourth aspect, wherein surface layers of the metallic aluminum regions are nitrided with ammonia before formation of the Group III nitride-based compound semiconductor single-crystal layer.

A sixth aspect of the present invention is drawn to a specific embodiment of the production method according to the second or third aspect, wherein the buffer layer is formed after formation of the metallic aluminum regions on the substrate.

In the light-emitting device of the present invention, which includes island-like-pattern metallic aluminum regions provided between a substrate and a Group III nitride-based compound semiconductor single-crystal layer, when a light-emitting layer is provided atop the Group III nitride-based compound semiconductor single-crystal layer; i.e., when the light-emitting layer is provided on the distal side with respect to the substrate, a portion of light emitted from the light-emitting layer toward the substrate is reflected by the metallic aluminum regions, and thus light extraction performance is improved (first aspect).

Such a light-emitting device may be produced through the following procedure: metallic aluminum regions are formed on a substrate; and a Group III nitride-based compound semiconductor single-crystal layer is epitaxially grown, via a buffer layer, on a portion of the substrate surface on which no metallic aluminum regions are formed (second aspect).

The metallic aluminum regions may be embedded in dents formed in the substrate (third aspect).

The buffer layer may be formed before formation of the metallic aluminum regions (fourth aspect) or after formation of the metallic aluminum regions (sixth aspect). In the case where the buffer layer is formed before formation of the metallic aluminum regions, when surface layers of the metallic aluminum regions are nitrided before epitaxial growth of the Group III nitride-based compound semiconductor single-crystal layer, epitaxial growth of the single-crystal layer is not inhibited, which is preferred (fifth aspect). As used herein, the expression "metallic aluminum regions" should be construed to include the case where a single metallic aluminum region is provided on the substrate.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

The ratio of the area of metallic aluminum regions formed on a surface of a substrate to that of the substrate surface is preferably 10% to 60%. When the area ratio is less than 10%, the amount of light reflected by the metallic aluminum regions is very small, which is not preferred. In contrast, when the area ratio exceeds 60%, the area of a portion of the substrate on which a Group III nitride-based compound semiconductor single-crystal layer is epitaxially grown is reduced, and thus the single-crystal layer exhibits poor crystallinity, which is not preferred.

Generally, the width of island-like-pattern metallic aluminum regions may be several micrometers. When, for example, metallic aluminum regions are formed in a stripe pattern or a grid pattern, the width of the regions is 1 to 10 μm. The width of formed metallic aluminum regions cannot be limitlessly increased, since the metallic aluminum regions must be covered with a Group III nitride-based compound semiconductor single-crystal layer which is laterally grown, via a buffer layer, on portions of the substrate adjacent to the metallic aluminum regions.

No particular limitation is imposed on the interval between adjacent metallic aluminum regions, so long as the ratio of the total area of metallic aluminum regions to that of the substrate surface falls within the aforementioned range.

No particular limitation is imposed on the method for forming island-like-pattern metallic aluminum regions.

When metallic aluminum regions are formed on a flat surface of a substrate, a metallic aluminum layer (thin film) may be formed on the entire flat surface, followed by removal of unwanted portions through etching by use of a mask. Alternatively, a resist mask for the lift-off process may be formed on the substrate, followed by vapor deposition of aluminum, and unwanted portions may be removed together with the resist mask so that aluminum regions (corresponding to openings of the mask) remain on the substrate.

When a substrate is processed for formation of metallic aluminum regions, dents may be formed in the substrate in a predetermined island-like pattern, and aluminum may be provided on the substrate through, for example, vapor deposition, followed by removal of unwanted portions. No particular limitation is imposed on the method for removing such unwanted portions, and, for example, wet etching may be carried out.

Four specific embodiments of the present invention will next be described.

Figure 1:
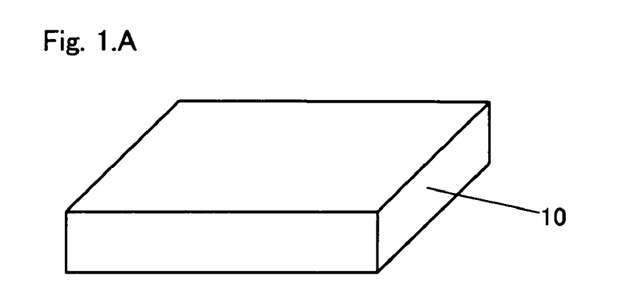
FIGS. 1A to 1F are sketches showing a process corresponding to a first embodiment of the present invention.

FIGS. 1A to 1F show a process for producing a Group III nitride-based compound semiconductor light-emitting device according to a first embodiment of the present invention, wherein metallic aluminum regions are provided between a substrate and a Group III nitride-based compound semiconductor single-crystal layer. FIGS. 1A to 1C are perspective views, and FIGS. 1D to 1F are cross-sectional views.

Firstly, for example, a sapphire substrate 10 is provided (FIG. 1A). Aluminum regions 20a are formed on a surface of the sapphire substrate 10 in a dot pattern (FIG. 1B), or aluminum regions 20b are formed on a surface of the sapphire substrate 10 in a stripe pattern (FIG. 1C). Hereinafter, the aluminum regions 20a or the aluminum regions 20b may be referred to simply as the "aluminum regions 20." The aluminum regions 20 may be formed in a grid pattern, or may be formed randomly (i.e., in an irregular pattern).

Subsequently, as shown in FIG. 1D, an aluminum nitride buffer layer 30 is formed so as to cover the aluminum regions 20. Preferably, the AlN buffer layer 30 has a thickness of 10 to 100 nm, and the layer 30 is formed from trimethylaluminum and ammonia at a substrate temperature of 400° C. Alternatively, the AlN buffer layer 30 may be formed through magnetron sputtering.

Thereafter, as shown in FIG. 1E, the substrate temperature is elevated in an ammonia atmosphere, and trimethylgallium is introduced at a substrate temperature of 1,000° C. or higher, to thereby form a gallium nitride single-crystal layer 40. The gallium nitride single-crystal layer 40 is epitaxially grown primarily on portions of the AlN buffer layer 30 corresponding to portions of the sapphire substrate 10 on which the aluminum regions 20 are not formed, and the layer 40 covers the portions of the AlN buffer layer 30 right over the aluminum regions 20 through lateral growth. Thus, the GaN single-crystal layer 40 covers the entire surface of the resultant wafer (FIG. 1F). Since the aluminum regions 20 are present, the crystallographic characteristics of the surface of the sapphire substrate 10 are not reflected on portions of the AlN buffer layer 30 that are provided on the aluminum regions 20. Therefore, the portions of the AlN buffer layer 30 on the aluminum regions 20 do not serve as nuclei for growth of a gallium nitride single crystal.

Figure 2:
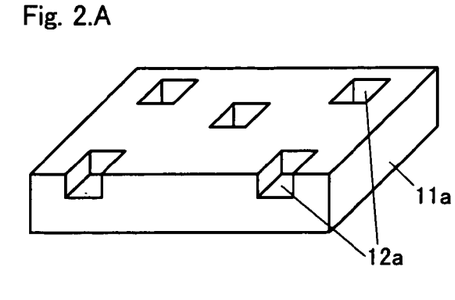
FIGS. 2A to 2G are sketches showing a process corresponding to a second embodiment of the present invention.

FIGS. 2A to 2G show a process for producing a Group III nitride-based compound semiconductor light-emitting device according to a second embodiment of the present invention, wherein metallic aluminum regions are provided between a substrate and a Group III nitride-based compound semiconductor single-crystal layer. FIGS. 2A to 2D are perspective views, and FIGS. 2E to 2G are cross-sectional views.

Firstly, for example, a sapphire substrate 11a having dents 12a formed in a dot pattern is provided (FIG. 2A). Alternatively, a sapphire substrate 11b having dents 12b formed in a stripe pattern is provided (FIG. 2B). When the sapphire substrate 11a having the dot-pattern dents 12a is employed, aluminum is embedded in the dents 12a, to thereby form aluminum regions 21a in a dot pattern (FIG. 2C).

When the sapphire substrate 11b having the stripe-pattern dents 12b is employed, aluminum is embedded in the dents 12b, to thereby form aluminum regions 21b in a stripe pattern (FIG. 2D). Hereinafter, the aluminum regions 21a or the aluminum regions 21b may be referred to simply as the "aluminum regions 21." The aluminum regions 21 may be formed in a grid pattern.

Hereinafter, the sapphire substrate 11a or the sapphire substrate 11b may be referred to simply as the "sapphire substrate 11."

Subsequently, as shown in FIG. 2E, an aluminum nitride buffer layer 30 is formed so as to cover the aluminum regions 21. Preferably, the AlN buffer layer 30 has a thickness of 10 to 100 nm, and the layer 30 is formed from trimethylaluminum and ammonia at a substrate temperature of 400° C. Alternatively, the AlN buffer layer 30 may be formed through magnetron sputtering.

Thereafter, as shown in FIG. 2F, the substrate temperature is elevated in an ammonia atmosphere, and trimethylgallium is introduced at a substrate temperature of 1,000° C. or higher, to thereby form a gallium nitride single-crystal layer 40. The gallium nitride single-crystal layer 40 is epitaxially grown primarily on portions of the AlN buffer layer 30 corresponding to portions of the sapphire substrate 11 on which the aluminum regions 21 are not formed, and the layer 40 covers the portions of the AlN buffer layer 30 right over the aluminum regions 21 through lateral growth. Thus, the GaN single-crystal layer 40 covers the entire surface of the resultant wafer (FIG. 2G). Since the aluminum regions 21 are present, the crystallographic characteristics of the surface of the sapphire substrate 11 are not reflected on portions of the AlN buffer layer 30 that are provided on the aluminum regions 21. Therefore, the portions of the AlN buffer layer 30 on the aluminum regions 21 do not serve as nuclei for growth of a gallium nitride single crystal.

Figure 3:
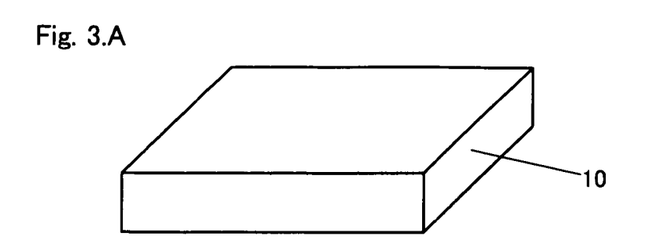
FIGS. 3A to 3G are sketches showing a process corresponding to a third embodiment of the present invention.

FIGS. 3A to 3G show a process for producing a Group III nitride-based compound semiconductor light-emitting device according to a third embodiment of the present invention, wherein metallic aluminum regions are provided between a substrate and a Group III nitride-based compound semiconductor single-crystal layer. FIGS. 3A to 3D are perspective views, and FIGS. 3E to 3G are cross-sectional views.

Firstly, for example, a sapphire substrate 10 is provided (FIG. 3A). An aluminum nitride buffer layer 30 is formed on a surface of the sapphire substrate 10. Preferably, the AlN buffer layer 30 has a thickness of 10 to 100 nm, and the layer 30 is formed from trimethylaluminum and ammonia at a substrate temperature of 400° C. Alternatively, the AlN buffer layer 30 may be formed through magnetron sputtering.

Thereafter, aluminum regions 20a are formed on the buffer layer 30 in a dot pattern (FIG. 3C), or aluminum regions 20b are formed on the buffer layer 30 in a stripe pattern (FIG. 3D). Hereinafter, the aluminum regions 20a or the aluminum regions 20b may be referred to simply as the "aluminum regions 20." The aluminum regions 20 may be formed in a grid pattern, or may be formed randomly (i.e., in an irregular pattern).

Subsequently, as shown in FIG. 3E, the substrate temperature is elevated in an ammonia atmosphere. Through this temperature elevation, surface layers 20f of the aluminum regions 20 are nitrided, to thereby form nitride layers 22 (FIG. 3F). Through nitridation, nitrogen-deficient portions disappear in the surface of the AlN buffer layer 30, and the layer 30 exhibits improved crystallinity.

Trimethylgallium is introduced at a substrate temperature of 1,000° C. or higher, to thereby form a gallium nitride single-crystal layer 40. The gallium nitride single-crystal layer 40 is epitaxially grown primarily on portions of the AlN buffer layer 30 corresponding to portions of the sapphire substrate 10 on which the aluminum regions 20 are not formed, and the layer 40 covers the portions of the nitride layers 22 right over the aluminum regions 20 through lateral growth. Thus, the GaN single-crystal layer 40 covers the entire surface of the resultant wafer (FIG. 3G). The nitride layers 22 (i.e., surface layers of the aluminum regions 20) are formed of miscellaneous crystals. Since the aluminum regions 20 are present, the crystallographic characteristics of the surface of the sapphire substrate 10 are not reflected on the nitride layers 22. Therefore, the nitride layers 22 do not serve as nuclei for growth of a gallium nitride single crystal.

Figure 4:
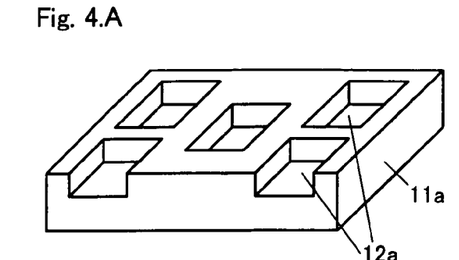
FIGS. 4A to 4I are sketches showing a process corresponding to a fourth embodiment of the present invention.

FIGS. 4A to 4I show a process for producing a Group III nitride-based compound semiconductor light-emitting device according to a fourth embodiment of the present invention, wherein metallic aluminum regions are provided between a substrate and a Group III nitride-based compound semiconductor single-crystal layer. FIGS. 4A to 4F are perspective views, and FIGS. 4G to 4I are cross-sectional views.

Firstly, for example, a sapphire substrate 11a having dents 12a formed in a dot pattern is provided (FIG. 4A). Alternatively, a sapphire substrate 11b having dents 12b formed in a stripe pattern is provided (FIG. 4B). An aluminum nitride buffer layer 30 is formed uniformly on a surface of the sapphire substrate 11a or 11b (FIG. 4C or 4D). Preferably, the AlN buffer layer 30 has a thickness of 10 to 100 nm, and the layer 30 is formed from trimethylaluminum and ammonia at a substrate temperature of 400° C. Alternatively, the AlN buffer layer 30 may be formed through magnetron sputtering.

When the sapphire substrate 11a having the dot-pattern dents 12a is employed, aluminum is embedded in the dents 12a coated with the AlN buffer layer 30, to thereby form aluminum regions 21a in a dot pattern (FIG. 4E).

When the sapphire substrate 11b having the stripe-pattern dents 12b is employed, aluminum is embedded in the dents 12b coated with the AlN buffer layer 30, to thereby form aluminum regions 21b in a stripe pattern (FIG. 4F). Hereinafter, the aluminum regions 21a or the aluminum regions 21b may be referred to simply as the "aluminum regions 21." The aluminum regions 21 may be formed in a grid pattern.

Hereinafter, the sapphire substrate 11a or the sapphire substrate 11b may be referred to simply as the "sapphire substrate 11."

Subsequently, as shown in FIG. 4G, the substrate temperature is elevated in an ammonia atmosphere. Through this temperature elevation, surface layers 21f of the aluminum regions 21 are nitrided, to thereby form nitride layers 22 (FIG. 4H). Through nitridation, nitrogen-deficient portions disappear in the surface of the AlN buffer layer 30, and the layer 30 exhibits improved crystallinity.

Trimethylgallium is introduced at a substrate temperature of 1,000° C. or higher, to thereby form a gallium nitride single-crystal layer 40. The gallium nitride single-crystal layer 40 is epitaxially grown primarily on portions of the AlN buffer layer 30 corresponding to portions of the sapphire substrate 11 on which the aluminum regions 21 are not formed, and the layer 40 covers the portions of the nitride layers 22 right over the aluminum regions 21 through lateral growth. Thus, the GaN single-crystal layer 40 covers the entire surface of the resultant wafer (FIG. 4I). The nitride layers 22 (i.e., surface layers of the aluminum regions 21) are formed of miscellaneous crystals. Since the aluminum regions 21 are present, the crystallographic characteristics of the surface of the sapphire substrate 11 are not reflected on the nitride layers 22. Therefore, the nitride layers 22 do not serve as nuclei for growth of a gallium nitride single crystal.

EXAMPLES

Example 1

Figure 5:
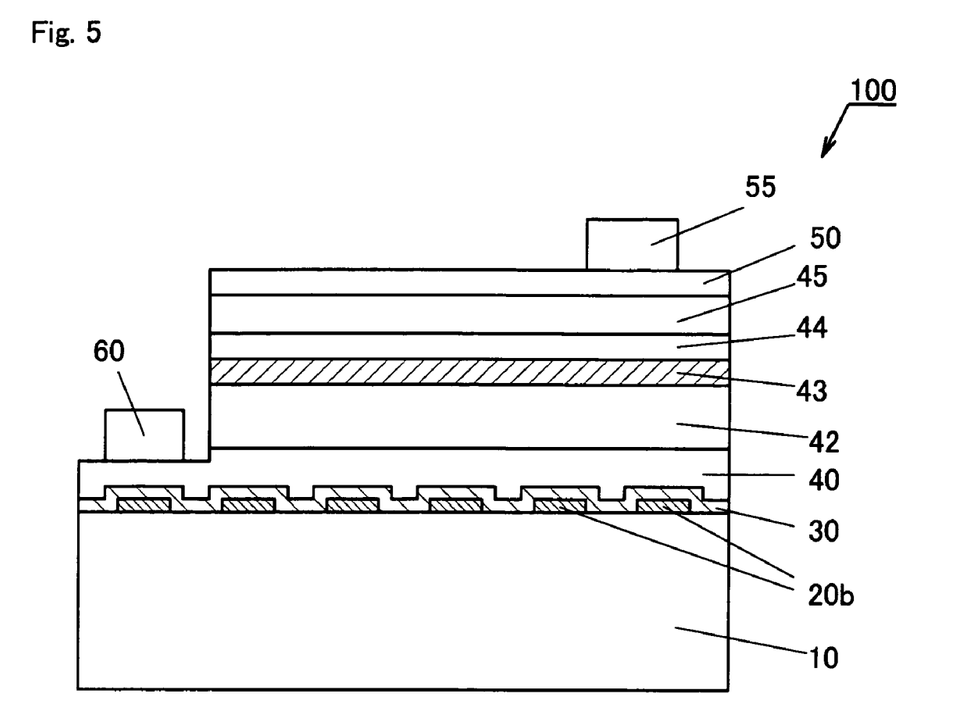
FIG. 5 is a cross-sectional view of the configuration of a semiconductor light-emitting device 100 according to Example 1 of the present invention.

A semiconductor light-emitting device 100 shown in FIG. 5 was produced through the process shown in FIGS. 1A to 1F by use of a sapphire substrate 10 having thereon aluminum regions 20b formed in a stripe pattern.

FIG. 5 is a cross-sectional view of the configuration of a Group III nitride-based compound semiconductor light-emitting device 100 according to Example 1 of the present invention. The Group III nitride-based compound semiconductor light-emitting device 100 includes a sapphire substrate 10; aluminum regions 20b which are formed on the substrate 10; an aluminum nitride (AlN) buffer layer 30 (thickness: about 15 nm); and a silicon (Si)-doped GaN n-contact layer 40 (thickness: about 4 μm) formed on the buffer layer 30. On the n-contact layer 40 is provided an n-cladding layer 42 (thickness: about 74 nm) formed of 10 layer units, each including an undoped $In_{0.1}Ga_{0.9}N$ layer, an undoped GaN layer, and a silicon (Si)-doped GaN layer.

On the n-cladding layer 42 is provided a light-emitting layer 43 having a multiple quantum well (MQW) structure including alternately stacked eight well layers and eight barrier layers, in which each well layer is formed of an $In_{0.2}Ga_{0.8}N$ layer (thickness: about 3 nm), and each barrier layer is formed of a GaN layer (thickness: about 2 nm) and an $Al_{0.06}Ga_{0.94}N$ layer (thickness: 3 nm). On the light-emitting layer 43 is provided a p-cladding layer 44 (thickness: about 33 nm) formed of multiple layers including a p-type $Al_{0.3}Ga_{0.7}N$ layer and a p-type $In_{0.08}Ga_{0.92}N$ layer. On the p-cladding layer 44 is provided a p-contact layer 45 (thickness: about 80 nm) having a layered structure including two p-type GaN layers having different magnesium concentrations.

On the p-contact layer 45 is provided a light-transmitting electrode 50 made of indium tin oxide (ITO) and having a thickness of 50 nm (less than 1/(4n) of the emission wavelength (470 nm) of the light-emitting layer 43 (wherein n represents the refractive index of ITO)). An electrode 60 is provided on an exposed surface of the n-contact layer 40. The electrode 60 is formed of a vanadium (V) layer (thickness: about 20 nm) and an aluminum (Al) layer (thickness: about 2 μm). An electrode pad 55 made of a gold (Au) alloy is provided on a portion of the light-transmitting electrode 50.

The Group III nitride-based compound semiconductor light-emitting device 100 shown in FIG. 5 is of a face-up type (i.e., light is extracted upward).

The aluminum regions 20b were formed in a stripe pattern (width: 3 μm, interval between adjacent aluminum regions: 5 μm, and thickness: about 0.1 μm) through vacuum deposition and the lift-off process.

For comparison, the procedure of Example 1 was repeated, except that the aluminum regions 20b were not formed, to thereby produce a semiconductor light-emitting device 900.

In the semiconductor light-emitting device 100, light extraction performance was found to be increased by 16%, as compared with the case of the light-emitting device 900. However, no difference in other performance characteristics was observed between these devices.

Thus, the present invention realized improvement of light extraction performance without impairing other performance characteristics.

What is claimed is:

1. A method for producing a Group III nitride-based compound semiconductor light-emitting device, comprising:

forming metallic aluminum regions on a substrate;

forming a Group III nitride-based compound semiconductor single-crystal layer, via a buffer layer, on a portion of the substrate on which no metallic aluminum regions are formed, so that the metallic aluminum regions are covered with the Group III nitride-based compound semiconductor single-crystal layer; and stacking, on the Group III nitride-based compound semiconductor single-crystal layer, a Group III nitride-based compound semiconductor layer having a predetermined composition and containing an impurity of interest.

2. A method for producing a Group III nitride-based compound semiconductor light-emitting device according to claim 1, wherein dents are formed in the substrate, and the metallic aluminum regions are formed in the dents.

3. A method for producing a Group III nitride-based compound semiconductor light-emitting device according to claim 2, wherein the buffer layer is formed on the substrate before formation of the metallic aluminum regions.

4. A method for producing a Group III nitride-based compound semiconductor light-emitting device according to claim 2, wherein the buffer layer is formed after formation of the metallic aluminum regions on the substrate.

5. A method for producing a Group III nitride-based compound semiconductor light-emitting device according to claim 1, wherein the buffer layer is formed on the substrate before formation of the metallic aluminum regions.

6. A method for producing a Group III nitride-based compound semiconductor light-emitting device according to claim 5, wherein surface layers of the metallic aluminum regions are nitrided with ammonia before formation of the Group III nitride-based compound semiconductor single-crystal layer.

7. A method for producing a Group III nitride-based compound semiconductor light-emitting device according to claim 1, wherein the buffer layer is formed after formation of the metallic aluminum regions on the substrate.

* * * * *